(12) United States Patent
Kim

(10) Patent No.: US 6,717,356 B1
(45) Date of Patent: Apr. 6, 2004

(54) ORGANIC ELECTROLUMINESCENT DEVICE WITH TRAPEZOIDAL WALLS

(75) Inventor: Sung Tae Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 411 days.

(21) Appl. No.: 09/584,096

(22) Filed: May 31, 2000

Related U.S. Application Data

(62) Division of application No. 09/058,293, filed on Apr. 10, 1998, now Pat. No. 6,099,746.

(30) Foreign Application Priority Data

Sep. 18, 1997 (KR) ............................................. 97-47579

(51) Int. Cl.[7] ............................................. H05B 33/00
(52) U.S. Cl. ....................................... 313/504; 313/498
(58) Field of Search ................................. 313/504, 506, 313/512, 498, 503

(56) References Cited

U.S. PATENT DOCUMENTS 5,701,055 A  * 12/1997 Nagayama et al. ......... 313/504
5,742,129 A     4/1998 Nagayama et al. ......... 315/167
5,773,931 A  *  6/1998 Shi et al. ................. 313/509

FOREIGN PATENT DOCUMENTS

JP          08-227276          9/1996

* cited by examiner

*Primary Examiner*—Kenneth J. Ramsey
*Assistant Examiner*—Joseph Williams
(74) *Attorney, Agent, or Firm*—Fleshner & Kim LLP

(57) ABSTRACT

An organic electroluminescent device and a method for fabricating the same are disclosed, the method including the steps of (1) forming a plurality of first electrode stripes on a transparent substrate at fixed intervals, (2) forming an array of partition walls made of an electrically insulating material on the first electrode elements; having a trapezoidal structure with the lower side wider than the upper side, (3) forming an organic electroluminescent multilayer, the second electrode, and the first protection layer in succession on the entire surface including on top of the partition walls, (4) removing upper portions of films, unequivocally including the second electrode layer on top of the partition walls, whereby electrically isolating any two adjacent pixels, and (5) forming the second protection layer on top of the etched-out surface, whereby simplifying fabrication processes, improving product yield and reducing product cost.

8 Claims, 5 Drawing Sheets

ORGANIC ELECTROLUMINESCENT DEVICE WITH TRAPEZOIDAL WALLS

This application is a Divisional of application Ser. No. 90/058,293 filed Apr. 10, 1998 now U.S. Pat. No. 6,099,746.

BACKGROUND OF THE INVENTION

1. Field of the Invention

The present invention relates to a display, and more particularly, to an organic electroluminescent (EL) device and a method for fabricating the same.

2. Discussion of the Related Art

Organic EL devices, also called organic light emitting diodes (LEDs), are becoming very popular because of their possible application to flat panel displays (FPDs). They are extremely thin, matrix-addressable and can be operated at a relatively low voltage, typically less than 15 volts. Furthermore, they have additional characteristics suitable for next generation FPDs such as little dependence on viewing angle and good device-formability on flexible substrates among other things. Organic LEDs differ fundamentally from conventional inorganic LEDs. While the charge transfer in inorganics is band-like in nature and the electron-hole recombination results in the interband emission of light, organic films are generally characterized by the low-mobility activated hopping transport and the emission is excitonic. Organic EL devices are also substantially different from conventional inorganic EL devices, especially in that organic EL devices can be operated at low DC voltages.

A substantial amount of research has been directed toward the efficiency improvement and color control of organic LEDs. The efficiency of some organic EL devices has now been demonstrated to be close to its theoretical limit and certainly adequate for many commercial applications. Moreover the color control is probably not limiting for many potential applications. In light of this, we believe that the outlook for commercial applications is excellent for organic EL devices. Their performance is quite satisfactory for many applications. It is valuable to think in terms of specific products and manufacturing techniques for the commercialization of organic EL devices. Consideration of the specific applications leads us to believe that more work on manufacturability, uniformity, reliability, and systems issues is required to commercialize organic EL devices.

Pixellation or patterning, especially of electroluminescent and second electrode materials, is one of the key issues to be solved before the commercialization of organic EL devices. The use of many conventional pixellation techniques is precluded due to the nature of organic materials which are extremely vulnerable to the attack by most solvents. Various efforts have been made to utilize shadowing effects for the film patterning. One approach was introduced by C. Tang et al. in U.S. Pat. No. 5,294,870, wherein partition walls were used as a means to give a shadowing effect. Therein each stripe of the second electrode is supposed to be separated by depositing the second electrode material onto the transparent support with relatively high partition walls at an oblique angle with the surface normal. The idea may be conceivable, but is not suitable at all for mass production. First of all, it is impossible to have a vapor source which may set the direction of traveling metallic vapor at a constant angle with the surface normal over the whole panel surface. Whether one has either a point source or a large area source, the angle would vary with the position of pixel on the transparent support because of the diverging nature of vapor. One may be able to obtain a certain degree of separation with a complicate arrangement of source and support, but only at the sacrifice of production field. More practical processes have been proposed by K. Nagayama et al. in U.S. Pat. No. 5,701,055 wherein electrically insulating, ramparts, like a bunch of tiny umbrellas, serve as a means to shadow the incoming vapor. An advantage of U.S. Pat. No. 5,701,055 over U.S. Pat. No. 5,294,870 is that depositions do not need to be made at an oblique angle, which markedly widens the process window.

FIGS. 1a–1d illustrate typical process steps proposed in U.S. Pat. No. 5,701,055. Referring to FIG. 1a, an array of anode stripes 2 is formed of typically indium tin oxide on a transparent substrate 1, and insulating patterns 3 are formed thereon. As shown in FIG. 1b, next, each of ramparts 4 is formed to fit into the small gap between a pair of the insulating patterns 3. The rampart 4 with a pair of overhangs 8 serves an important role to shadow the incoming vapor. When organic materials and a second electrode material are vapor deposited, the films are formed on top of the ramparts as well as on the surface between the ramparts, as seen in FIG. 1c. The important point is that the films are not formed on the side surface of the ramparts due to a shadowing effect, which ensures the electrical insulation between any two adjacent pixels. After the formation of an electroluminescent multilayer 5 and a second electrode 6 on the first electrode 2 in succession, an encapsulation layer 7 is formed, as in FIG. 1d. In summary, the background art of U.S. Pat. No. 5,701,055 appears to be an effective way to pixellate an organic electroluminescent display panel.

However, the background art EL device has several drawbacks as follows.

(1) While a variety of ramparts with the different shape is shown in U.S. Pat. No. 5,701,055, the most typical one looks like that shown in FIG. 1b. Since this type of rampart 4 easily causes short-circuits between the first and second electrodes at the edges of the second electrode stripe, it is often necessary to form additional insulating patterns 3. But it is not necessary to fabricate them in the present invention.

(2) Ramparts are often formed of photoresist and the most important parts of them are the overhangs 8 which actually shadow the incoming vapor. It is quite a delicate process to make ramparts with good overhangs. The present invention provides ramparts or partition walls the production of which can be much simplified.

(3) Ramparts remain standing on the panel surface even after the completion of the device fabrication. A part of rampart itself or films on top of them may fall down to damage the device locally during the subsequent fabrication processes. To avoid this kind of potential problems, it is recommended to have a stable structure: the shape of trapezoid in the present invention is structurally more stable compared to the inverted trapezoid of the related art.

SUMMARY OF THE INVENTION

Accordingly, the present invention is directed to an organic electroluminescent device and a method for fabricating the same that substantially obviates one or more of the problems due to the limitations and disadvantages of the related art.

An object of the present invention is to provide an organic electroluminescent device and a method for fabricating the same, in which adequate pixellation can be achieved using simple and stable partition walls.

Another object of this invention lies in that the stable and solid feature of the partition walls employed in the invention can make a contribution towards the enhanced long-term stability of the electroluminescent device fabricated thereby.

Additional features and advantages of the invention will be set forth in the description which follows, and in part will be apparent from the description, or may be learned by practice of the invention. The objectives and other advantages of the invention will be realized and attained by the stricture particularly pointed out in the written description and claims hereof as well as the appended drawings.

To achieve these and other advantages in accordance with the purpose of the present invention as embodied and broadly described the electroluminescent device includes a pluralist of pixels each with a first electrode, an organic luminescence multilayer, a second electrode, and successively prepared protection layers. For the purpose of pixellation, the device also has an array of partition walls with a trapezoidal structure made of an electrically insulating material. To achieve the electrical isolation between two adjacent pixels, the panel surface with a multilayer structure is subjected to a dry etching process.

In the other aspect of this invention, there is provided a method for fabrication an electroluminescent device, including the steps of (1) forming a plurality of first electrode stripes at fixed intervals on a transparent substrate, (2) forming an array of partition walls with a trapezoidal structure made of an electrically insulating material, (3) laminating an organic a electroluminescent multilayer and a second electrode layer in succession on the entire surface including on top of the partition walls, and (4) subjecting the panel surface to a dry etching process in order to remove a part of the films, especially the second electrode layer formed on top of the partition walls, thereby electrically isolating two adjacent pixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and constitute a part of this specification, illustrate embodiments of the invention and together with the descriptions serve to explain the principles of the invention.

In the drawings.

DETAILED DESCRIPTION OF THE PREFERRED EMBODIMENT

Reference will now be made in detail to the preferred embodiments of the present invention, an example of which is illustrated in the accompanying drawings. FIGS. 2a~2e illustrate the fabricating steps of an organic electroluminescent device in accordance with a preferred embodiment of the present invention which has basically a simple XY matrix structure with a plurality of first and second electrode stripes intersecting each other at 90 degree.

Figure 1A:
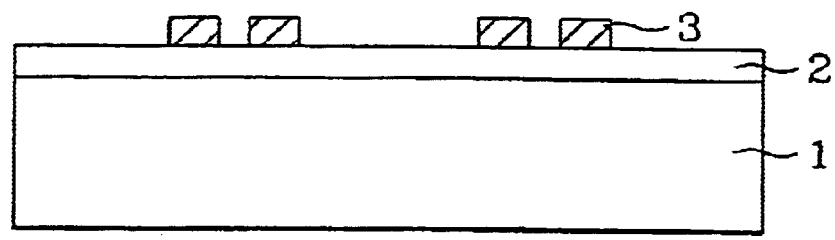
FIGS. 1a, 1b, 1c and 1d illustrate the fabrication steps of an organic electroluminescent device in accordance with a typical embodiment of the background art; and, FIGS. 2a, 2b, 2c, 2d and 2e illustrate the fabrication steps of an organic electroluminescent device in accordance with a preferred embodiment of the present invention.
Figure 1B:
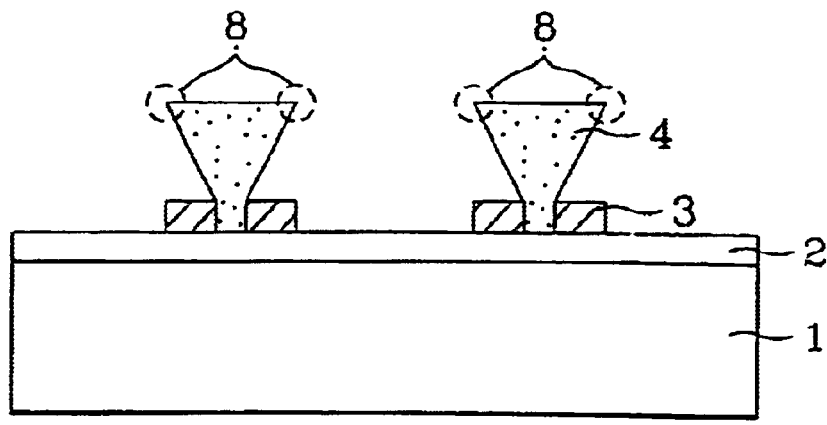
Figure 1C:
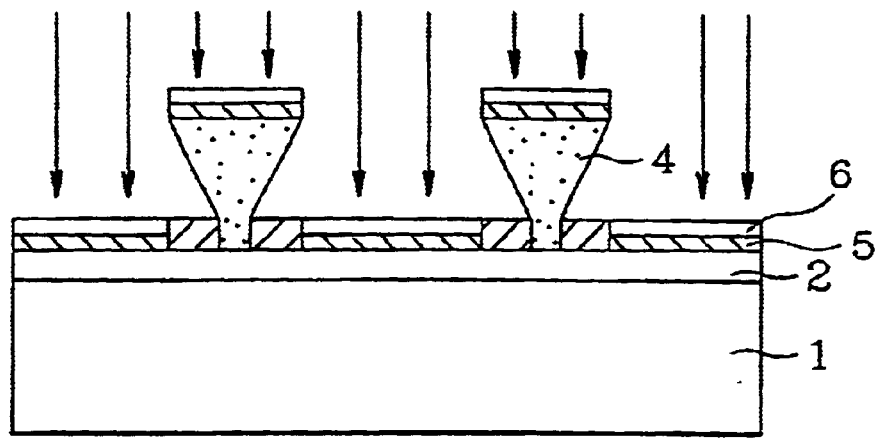
Figure 1D:
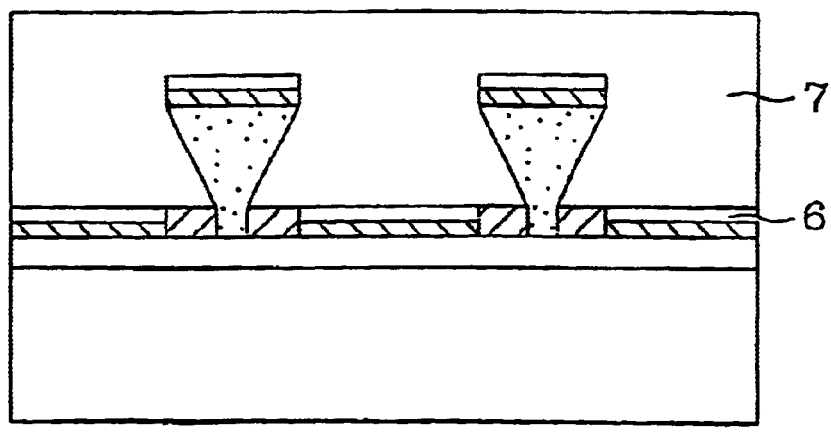
Figure 2A:
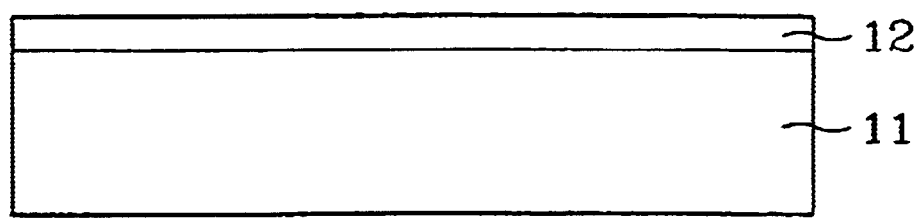
Figure 2B:
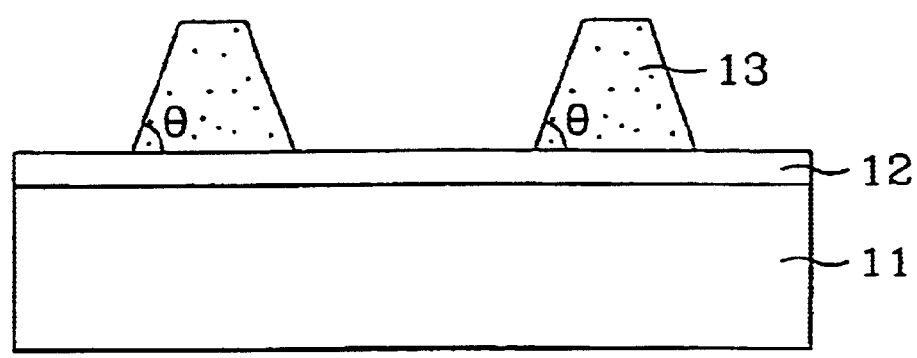
Figure 2C:
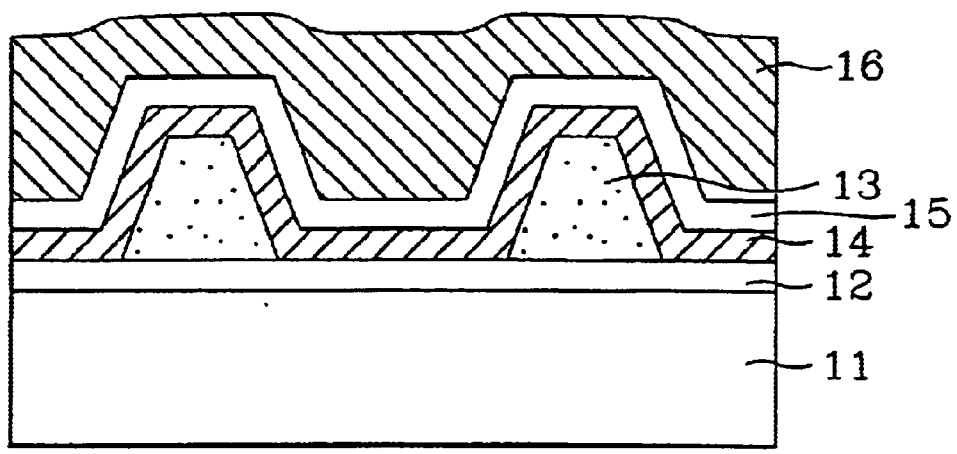
Figure 2D:
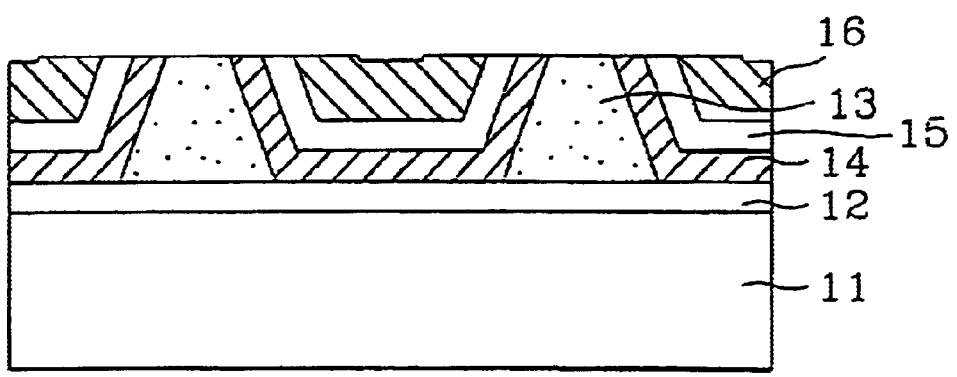
Figure 2E:
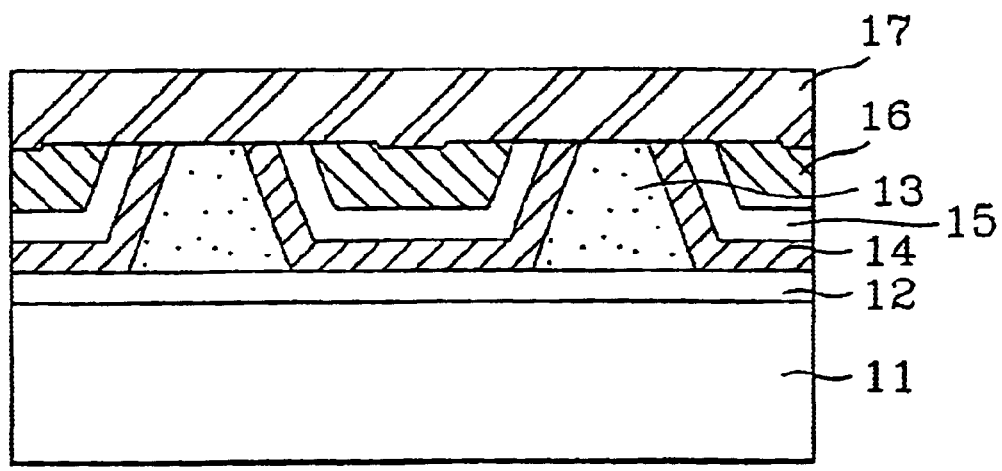

As shown in FIG. 2a, the fabrication processes begin with the formation of a plurality of the first electrode stripes 12 on a transparent substrate 11. Partition walls 13 may be made of either organic or inorganic materials as long as they are electrically insulating: for example, photoresist, silicon oxide, silicon nitride and silicon carbide among other things. After a film for partition walls 13 is coated on the first electrode elements 12, photolithography and etching processes are applied to pattern it as shown in FIG. 2b. Each partition wall 13 is preferably formed to have a trapezoidal structure with the angle θ being below 90° which is more stable and easy to fabricate compared to the background art. A partition wall 13 may be 500 nm~10,000 nm high, and preferably 2,000 nm high. It may have a width of 100 nm~50,000 nm though the width is more or less dependent on the display resolution, i.e. the pitch between pixels. Next the panel may be subjected to a process of vacuum annealing and UV hardening, especially if the partition walls 13 are made of organic materials such as photoresist, whereby the partition walls are hardened and residual solvents are removed as completely as possible Each rampart to the background art typically has a pair of overhangs which are often more fragile and susceptible to heat than other parts. But the partition walls of the present invention are structurally more stable and less susceptible to heat-treatments, which certainly widens the process window. On top of the transparent support with the partition walls 13, next, an organic electroluminescent multilayer 14, the second electrode layer 15 arid the first protection layer 16 are formed in succession, as shown in FIG. 2c. The EL multilayer 14 for green emission typically constitutes of (1) a buffer layer of copper phthalocyanine (CuPc) with a typical thickness of 10 nm~20 nm, (2) a hole transporting layer of N,N'-diphenyl-N,N'-bis(3-methylphenyl)-(1,1'-biphenyl)-4,4'-diamine (TPD) with a thickness of 30 nm~50 nm, and (3) an emitting layer of tris(8-hydroxy-quinolate)aluminum ($Alq_3$) co-deposited with a dopant of coumarin 6. The thickness of $Alq_3$ layer lies in the range of 40 nm~60 nm and the dopant concentration is roughly 1.0 wt. %. The second electrode 15 is often made of aluminum, Al:Li or Mg:Ag. The first protection layer 16 serves a role to protect the EL elements from moisture and oxygen, and may be made of one or more materials selected from metals, alloys and organics. It is also necessary for the outer surface of the layer 16 to be reasonably well planarized, as seen in FIG. 2c. The planarization of the first protection layer 16 contributes later to keeping unetched the EL multilayer and the second electrode in the emitting zone between a pair of partition walls while etching out those on top of the partition walls. In order to be moisture-resistant as well as planarized, the protection layer 16 may constitute of a multilayer with a moisture absorbing layer, a moisture resistant layer and a planarizing layer, the last of which is preferably formed by spin-coating or doctor blade method. FIG. 2d shows the step of etching out the upper part of films, unequivocally including the second electrode on top of the partition walls to ensure the electrical isolation between two adjacent pixels. The etching process is preferably carried out using a dry etching method such as reactive ion etching, and the selection of etching gases and etching parameters such as working pressure and plasma power should be carefully made for the balanced removal of involved materials. Finally, as seen in FIG. 2e, the second protection layer 17 is laminated on top of the etched surface to complete the fabrication processes of the present invention. The second protection layer differs from the first protection layer in that the former does not necessarily need a function of planarization.

The organic electroluminescent device of the present invention and the method for fabricating the same have the following advantages.

The use of a stable and simple structure for partition walls instead of those with overhangs used in the background art allows easy fabrication and thereby significant improvement in the production yield.

In addition, the stable and solid feature of the partition walls presumably makes a contribution towards the enhanced long-term stability of the device fabricated thereby.

It will be apparent to those skilled in the art that various modifications and variations can be made in the organic electroluminescent device and the method for fabricating the same of the present invention without departing from the spirit or scope of the invention.

What is claimed is:

1. An electroluminescent device having a plurality of pixels each with a first electrode stripe, an organic electroluminescent multilayer and a second electrode stripe, the device comprising:

a partition wall of an electrically insulating material projected from each of the first electrode stripes, the partition wall having a trapezoidal structure with a base closer to a substrate wider than a base away from the substrate, wherein side surfaces of the partition wall are substantially covered by the organic luminescence multilayer, and wherein the partition wall electrically isolates two adjacent pixels.

2. A device as claimed in claim 1, wherein the partition wall is formed of a material selected from photoresist, silicon nitride and silicon oxide.

3. A device as claimed in claim 1, further comprising a first protective film formed only on each of the emitting pixels and a second protective film formed on the entire surface including on top of the first protective film.

4. An electroluminescent device, comprising:

a first electrode layer having a plurality of electrode stripes positioned on a substrate;

a plurality of pixels formed on the first electrode layer, and an array of partition walls, formed directly above and on the first electrode layer, and made of an electrically insulating material said partition walls having a base closer to the substrate wider than a base further from the substrate;

wherein each of the plurality of pixels comprises a light emitting layer having a first surface that substantially covers side surfaces of the partition walls, and wherein each partition wall in the array of partition walls is positioned between at least two of the plurality of pixels, thereby electrically isolating the at least two pixels from each other.

5. The electroluminescent device of claim 4, further comprising a second protection layer on a surface of said plurality of electrically isolated pixels.

6. The electroluminescent device of claim 4, wherein the partition walls are formed of one of photo resist, silicon nitride and silicon oxide.

7. The electroluminescent device of claim 4, wherein each of said plurality of pixels further comprises:

a second electrode layer having a first surface in contact with a second surface of light emitting layer, and a first protection layer having a first surface in contact with a second surface of the second electrode layer, wherein each of the plurality of pixels is positioned between at least two partition walls.

8. The electroluminescent device of claim 4, wherein the light emitting layer comprises on organic electroluminescent layer.

* * * * *